United States Patent
Inami et al.

[11] Patent Number: 5,113,161
[45] Date of Patent: May 12, 1992

[54] CASE FOR HOUSING INTEGRATED MICROWAVE CIRCUITS

[75] Inventors: Kazuyoshi Inami; Hajime Kawano, both of Kanagawa, Japan

[73] Assignee: Mitsubishi Denki Kabushiki Kaisha, Tokyo, Japan

[21] Appl. No.: 661,527

[22] Filed: Feb. 25, 1991

[30] Foreign Application Priority Data

Mar. 1, 1990 [JP] Japan .................. 2-50711

[51] Int. Cl.$^5$ ............... H01P 1/00; H01P 3/08
[52] U.S. Cl. ........................... 333/246; 333/247
[58] Field of Search ............... 333/12, 246, 247; 330/307; 361/414, 415; 174/52.4

[56] References Cited

U.S. PATENT DOCUMENTS 4,951,014  8/1990  Wohlert et al. ............ 333/247 X

FOREIGN PATENT DOCUMENTS 129701  6/1988  Japan ................... 333/247
318802  12/1988  Japan ................... 333/247
204502  8/1989  Japan ................... 333/247

Primary Examiner—Paul Gensler
Attorney, Agent, or Firm—Wolf, Greenfield & Sacks

[57] ABSTRACT

A case for housing integrated microwave circuits comprises a metal conductor body for carrying the integrated circuits on the upper surface thereof, the first and second dielectric substrates stacked on each other and also stacked on the upper surface of the body and having square holes for receiving the integrated circuits. The first substrate has strip line patterns for connecting signal input/output pads of the integrated circuits to each other and external signal terminals, and openings each filled with a conductive metal connected to the body. The second substrate has openings each filled with the conductive metal and electromagnetic shielding partitions between the adjacent square holes to provide isolation of a wave guide mode between the integrated circuits. The openings of both substrates are correspondingly arranged to connect the conductive metals thereof so that electromagnetic shielding is effected.

13 Claims, 10 Drawing Sheets

CASE FOR HOUSING INTEGRATED MICROWAVE CIRCUITS

BACKGROUND OF THE INVENTION

1. Field of the Invention

The present invention relates to a case for housing integrated microwave circuits.

2. Description of Prior Art

FIG. 1 is a front view of a case for housing integrated microwave circuits in which integrated microwave circuits have been housed according to a prior mounting technique. In the drawing, reference numerals 49a–49d denote integrated microwave circuits, 50a–50h high-frequency signal input/output pads on the integrated microwave circuits, 51a–51h control signal input/output pads on the integrated microwave circuits, 52a–52d carriers for carrying the integrated microwave circuits, 53a–53c connection line substrates for connecting the adjacent integrated microwave circuits, 54 a case for receiving the integrated microwave circuits, 55a–55f electromagnetic shielding partitions for effecting isolation between the adjacent integrated microwave circuits, 56a and 56b coaxial connectors, 57a and 57b coaxial connector core wires, 58a–58h control signal feed-through terminals, and 59a–59h connecting ribbons or wires.

Next, operation of the prior art as shown in FIG. 1 will be described. In FIG. 1, a high-frequency signal is input to the integrated microwave circuit 49a via the coaxial connector 56a, the coaxial connector core wire 57a, the connecting ribbon 59a, and the high-frequency signal input/output pad 50a, where the input signal is set at a predetermined level, or amplitude by an external signal supplied into via the control signal feed-through terminals 58a and 58b. The high-frequency signal is then supplied to the high-frequency signal input/output pad 50b so as to be supplied to the integrated microwave circuit 49b via the connecting ribbon 59d, the connection line substrate 53a, the connecting ribbon 59e, and the high-frequency input/output pad 50c, where another predetermined level setting is performed in the same manner as previously mentioned. The signal inputting and level setting according to this procedure are then repeated, and the high-frequency signal is eventually output via the coaxial connector 56b. A spatial connection of a wave guide mode between the integrated microwave circuits is prevented by means of the electromagnetic shielding partitions 55a–55f provided on the housing case 54, whereby individual integrated microwave circuits are allowed to operate stably.

Since the integrated microwave circuits are mounted in the above conventional fashion as shown in FIG. 1, it is necessary to mount the coaxial connectors 56a and 56b, the control signal feed-through terminals 58a–58h, and the connection line substrates 53a–53c for forming electrical connections between the integrated microwave circuits 49a–49d which are separated by the electromagnetic shielding partitions 55a–55f in the housing case, and this leads to a problem that the number of element parts and manhours are increased. In addition, the coaxial connectors 56a and 56b and the feed-through terminals 58a–58h need to be of a hermetical type in order to provide total hermetic sealing of the housing case 54, and this leads to a problem that the manufacturing cost and size of the housing case 54 are increased.

SUMMARY OF THE INVENTION

The present invention has been made to solve the above problems, and an object of this invention is to provide a case for housing integrated microwave circuits that is small in size and easy to produce.

To attain the above object, a case for housing integrated microwave circuits according to the present invention comprises a metal conductor body for carrying said integrated microwave circuits on the upper surface thereof; a first dielectric substrate stack-joined on said upper surface of said metal conductor body, and having a plurality of holes for receiving said integrated circuits respectively, signal strip line patterns on the upper surface thereof for connecting high-frequency signal input/output pads of said integrated circuits to each other and to external signal terminals, and shielding openings each filled with a conductive metal material connected to said metal conductor body for effecting electromagnetic shielding, said shielding openings being provided at interval(s) equal to or less than λ/4, where λ is a wavelength of a high-frequency signal within a frequency band to be used; and a second dielectric substrate stack-joined on said first dielectric substrate, and having a plurality of holes associated with those in said first dielectric substrate for receiving said integrated circuits, a conductive metal plate for hermetical sealing and electromagnetic shielding on the upper surface thereof, shielding openings each filled with said conductive metal material connected between said conductive metal plate and said conductive metal material in each of said shielding openings of said first dielectric substrate, and electromagnetic shielding partitions between the adjacent holes for receiving said integrated circuits to provide an isolation of a wave guide mode between said integrated circuits.

Since the number of parts and assembly manhours can be reduced by constituting a receiving case main body of a plurality of dielectric substrates and forming high-frequency signal input/output terminals, control signal input/output terminals and electromagnetic shielding partitions as an integral part, and since it is easy to effect total hermetic sealing, a case for housing integrated microwave circuits according to the present invention is advantageous in that productivity can be increased.

DETAILED DESCRIPTION OF THE EMBODIMENTS

Figure 1:
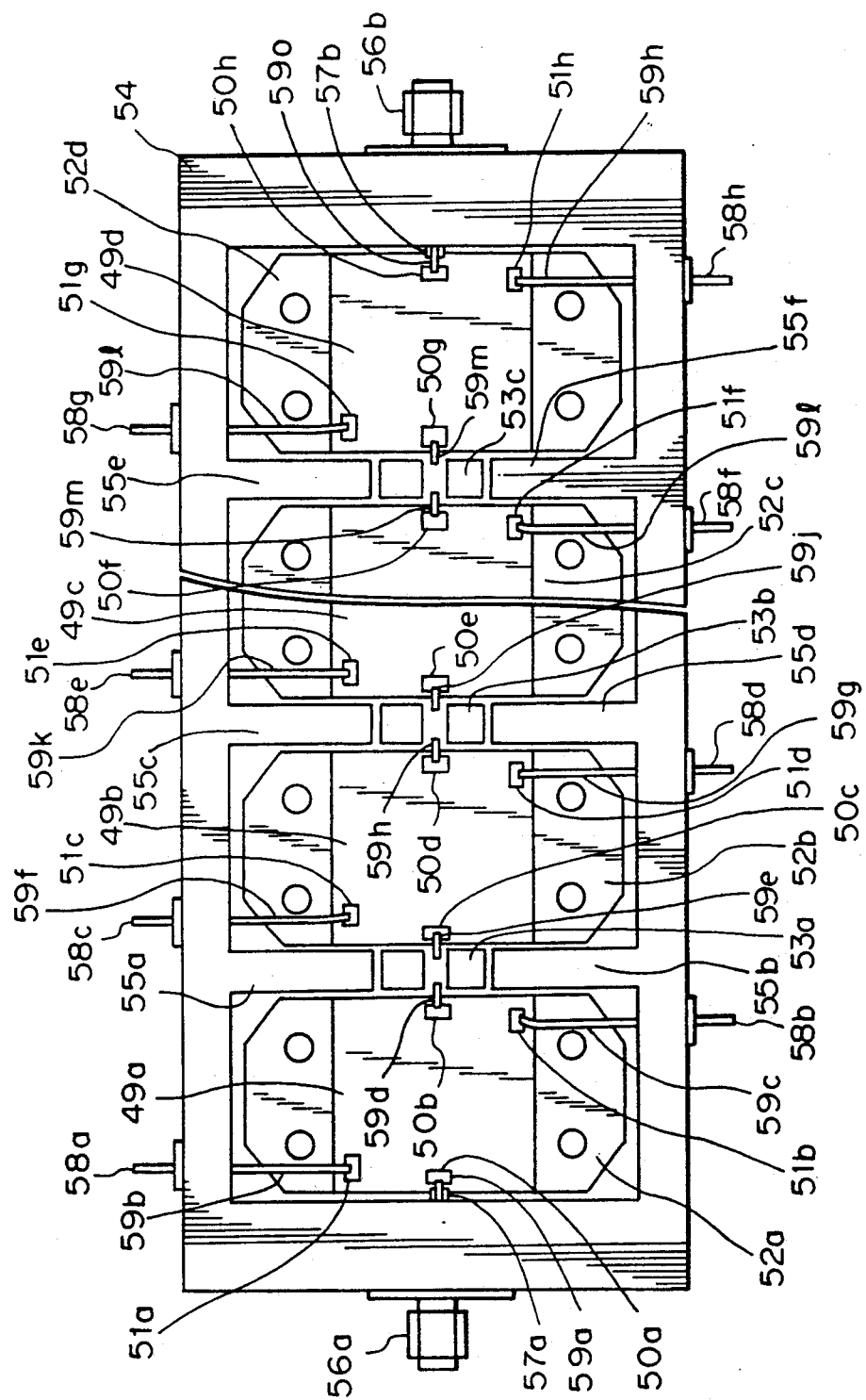
FIG. 1 is a front view of a case for receiving integrated microwave circuits in which integrated microwave circuits are received according to a prior art.
Figure 2:
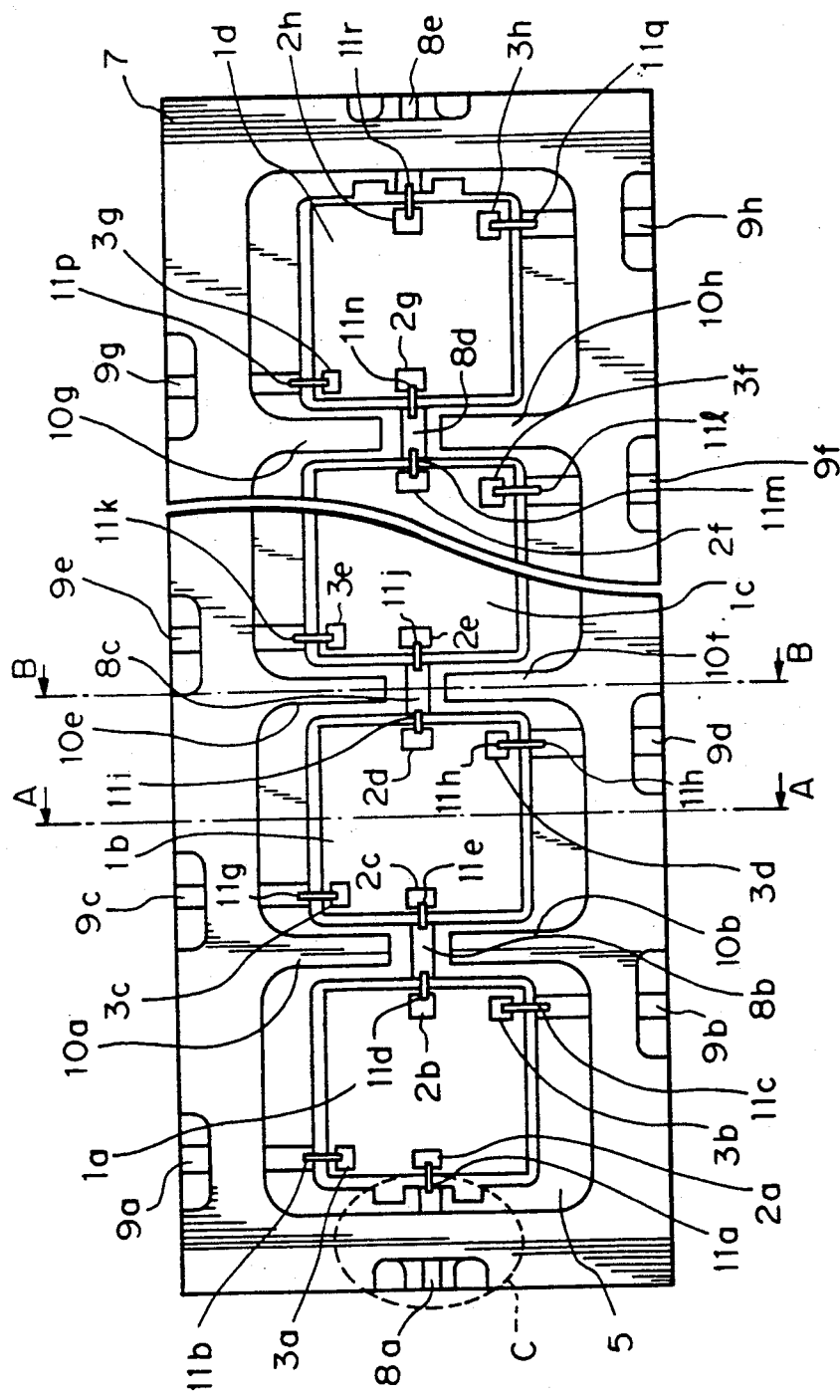
FIG. 2 is a front view of a case for housing integrated microwave circuits in which integrated microwave circuits are actually received according to the present invention.
Figure 3:
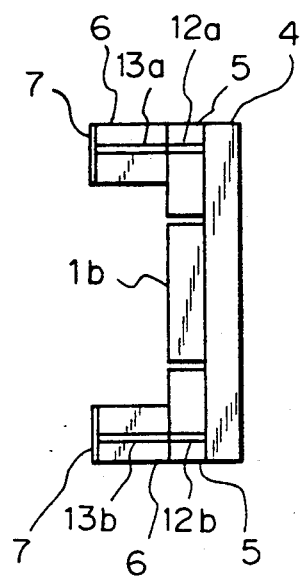
FIG. 3 is a cross-sectional view taken along a line A—A of FIG. 2.
Figure 4:
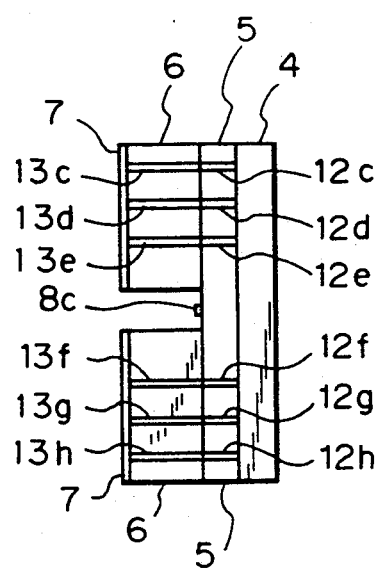
FIG. 4 is a cross-sectional view taken along a line B—B of FIG. 2.

FIG. 2 is a front view of a case housing integrated microwave circuits according to the present invention, and FIGS. 3 and 4 are cross-sectional views taken along lines A—A and B—B in FIG. 2. In these drawings, reference symbols 1a-1d denote integrated microwave circuits, 2a-2h high-frequency signal input/output pads on the integrated circuits, 3a-3h control signal input/output pads on the integrated circuits, 4 (in FIGS. 3 and 4) a metal conductor, 5 a first dielectric substrate having square holes for respectively receiving therein the integrated circuits, 6 (in FIGS. 3 and 4) a second dielectric substrate having square holes larger than those of the first dielectric substrate 5, 7 a conductive metal plate for hermetic sealing and electromagnetic shielding, 8a-8e high-frequency signal strip line patterns on the first dielectric substrate 5, 9a-9h control signal strip line patterns on the first dielectric substrate 5, 10a-10h electromagnetic shielding partitions comprising the second dielectric substrate 6 and the metal plate 7, 11a-11r connecting ribbons or wires, 12a-12h (in FIGS. 3 and 4) through holes in which conductive metals are filled for electromagnetic shielding and which is provided through the first dielectric substrate 5 at interval(s) equal to or less than λ/4, where λ is a wavelength of a signal within a frequency band to be used, and 13a-13h (in FIGS. 3 and 4) through holes provided through the second dielectric substrate 6 at the same interval(s) as those in the substrate 5 and filled conductive metals for electromagnetic shielding similar to those of the substrate 5.

In the embodiment mentioned above, a high-frequency signal is input through the high-frequency signal strip line pattern 8a and then supplied to the integrated microwave circuit 1a through the ribbon 11a and the input/output pad 2a. At the circuit 1a, the level or amplitude of the input signal is controlled to be set at a predetermined level in accordance with a control signal externally supplied across the control signal strip line patterns 9a and 9b. The level controlled high-frequency signal is then fed to the integrated circuit 1b through the input/output pad 2b, the ribbon 11d, the strip line pattern 8b and the input/output pad 2c, where a second predetermined level setting is performed in a similar manner to that for the integrated circuit 1a. Similar level settings are repeated at the integrated circuits 1c and 1d, and the high-frequency signal is eventually output through the high-frequency signal strip line pattern 8e.

In this embodiment, it is possible to prevent a leakage of the high-frequency signal to the outside and interference to the high-frequency signal from the outside. Any spatial connection of the wave guide mode between the integrated microwave circuits 1a-1d is also prevented by the electromagnetic shielding metals filled in the through holes 12a-12h and 13a-13h provided in the first and second dielectric substrates 5 and 6 as shown in FIGS. 3 and 4. Accordingly, each of the integrated circuits 1a-1d stably operates.

Figure 7:
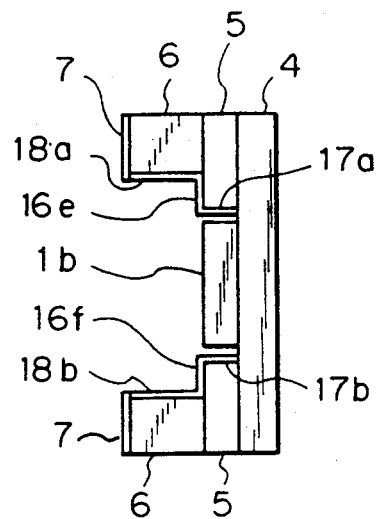
FIG. 7 is a drawing showing another example of effecting electromagnetic shielding by providing side through holes through which a conductor metal is filled.

A suitable electromagnetic shielding may be effected by employing side through holes, or grooves 17a and 17b filled with conductive metals at the inner ends of the first dielectric substrate 5 and side through holes, or notches 18a and 18b filled with conductive metals at the inner ends of the second dielectric substrate 6, and these metals are connected by connecting metals 16e and 16f as shown in FIG. 7, instead of employing the complete through holes filled with the metals as shown in FIG. 3. In this case, since the metal disposed side through holes 17a, 17b, 18a and 18b are more effective than the latter for providing substantial and complete electromagnetic shielding, it is preferable to employ the side through hole constitutions shown in FIG. 7 when electromagnetic shielding is required in a relatively high-frequency band.

Figure 5:
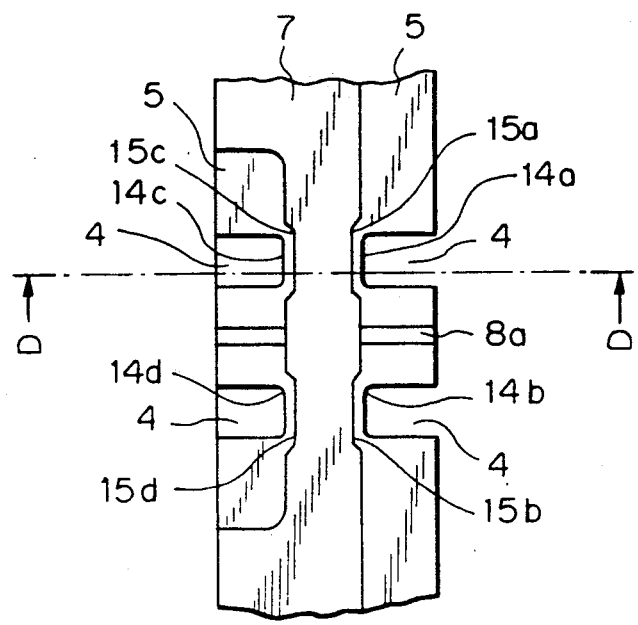
FIG. 5 is a drawing showing details of portion C in FIG. 2.
Figure 6:
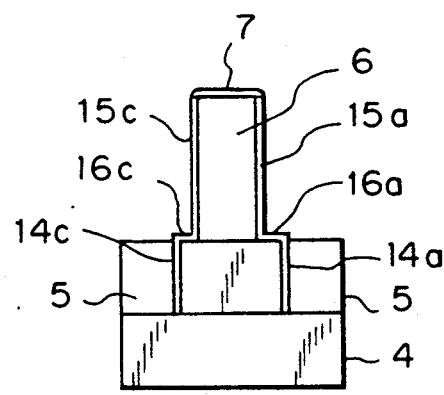
FIG. 6 is a cross-sectional view taken along a line D—D of FIG. 5.

FIG. 5 shows details of part C circled by a dotted line in FIG. 2, and FIG. 6 shows a cross-sectional view taken along a line D—D in FIG. 5. In FIGS. 5 and 6, symbols 14a-14d and 15a-15d denote side through holes, or grooves provided through the first and second dielectric substrates 5 and 6. These side through holes are filled conductive metals for grounding, symbols 16a and 16c denote connecting metals connected between the conductive metals filled into the side through holes 14a and 15a, as well as 14c and 15c. The other pairs of the metals of the side through holes 14b and 15b, 14d and 15d are also connected by conductive metals 16b and 16d (not shown).

As shown in FIGS. 5 and 6, the high-frequency signal strip line pattern 8a (or 8e) extending through below the second substrate 6 is coupled to TRIPLATE ® lines comprising the grounding conductive metals filled into the side through holes 14a-14d and 15a-15d in the first and second dielectric substrates 5 and 6 and the connecting metals 16a-16d, and thus the input high-frequency signal can pass through the second dielectric substrate 6 without being affected by a sealing cover (not shown) joined to the top surface of the conductor metal 7.

Figure 8:
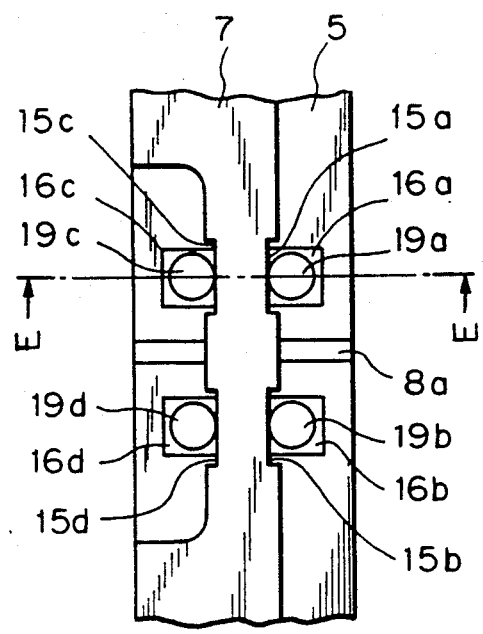
FIG. 8 is a drawing showing another example of converting a microstrip line into TRIPLATE ® lines.
Figure 9:
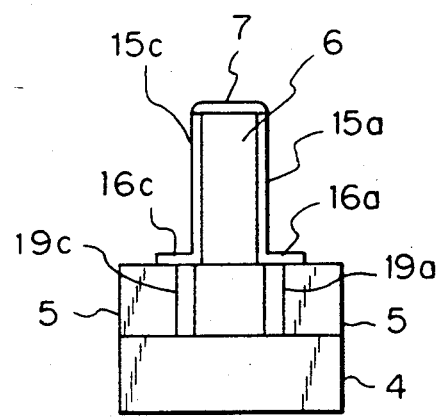
FIG. 9 is a cross-sectional view taken along a line E—E of FIG. 8.

FIG. 8 shows another example of the part C in FIG. 2 and FIG. 9 shows a cross-sectional view taken along a line E—E in FIG. 8. Instead of the grounding conductive metal filled side through holes 14a-14d as shown in FIGS. 5 and 6, grounding conductive metal filled through holes 19a–19d is provided in the first dielectric substrate 5 in this example. That is, neither of the through holes 19a–19d is a side through hole (or notch), as shown in FIGS. 8 and 9. In this example, similar effects to those in FIGS. 5 and 6 can be derived.

Figure 10:
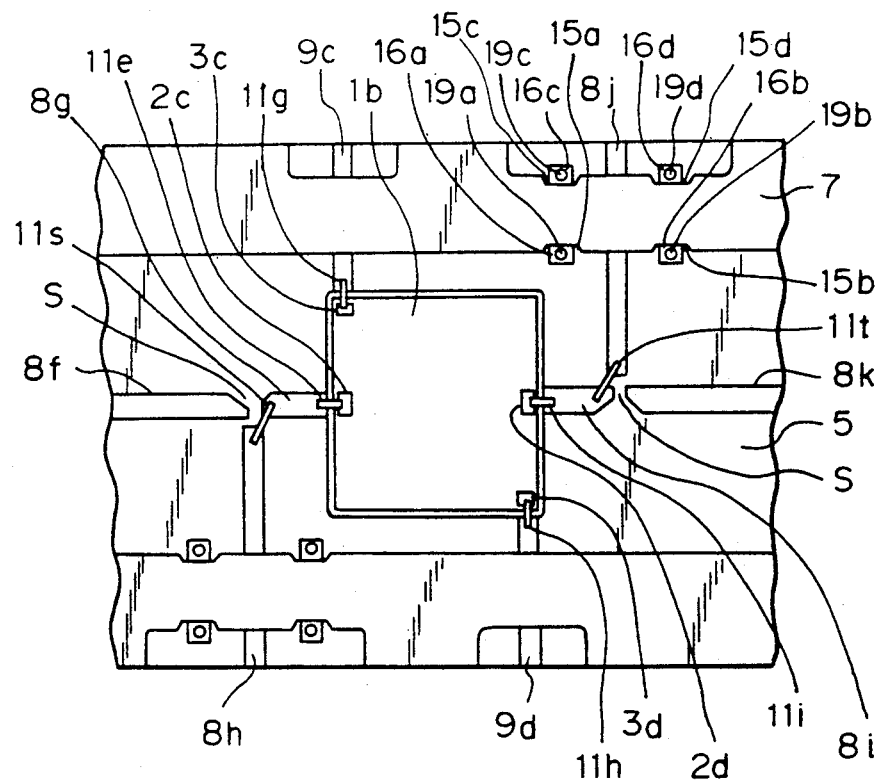
FIG. 10 is a drawing showing an example of monitoring the characteristics of an integrated microwave circuit.

Next, referring to FIG. 10, another embodiment which can output a monitor signal representing the characteristics of each integrated microwave circuit mounted in a case as mentioned above.

In FIG. 10, a monitor means for monitoring the characteristics of the integrated circuit 1b is illustrated as an example, wherein elements similar to those in FIGS. 2–9 are denoted by the same symbols. The high-frequency signal strip line pattern 8a (FIG. 2) is divided into two strip line patterns 8f and 8g and a high-frequency test signal strip line pattern 8h is provided for supplying a high-frequency test signal. These patterns 8f–8h are separated by a slit S and either the pattern 8f or 8h is selectively connected to the pattern 8g by changing over a connecting ribbon or wire 11S. Similarly, the signal output portion for the circuit 1a is constituted by strip line patterns 8i–8k and a connecting ribbon 11t.

In the condition shown in FIG. 10, the high-frequency test signal is input through the pattern 8h and supplied to the integrated circuit 1b through the connecting ribbon 11S, pattern 8g, connecting ribbon 11e and high-frequency signal input/output pad 2c. The input signal is then controlled in order for its level to be set at a predetermined level in accordance with the control signal input across the control signal strip line patterns 9c and 9d, and thereafter output to the outside through the high-frequency signal input/output pad 2d, the connecting ribbon 11i, the strip line pattern 8i, the connecting ribbon 11t and the strip line pattern 8j to monitor the characteristics of the integrated circuit 1b. After such a monitoring operation has been completed, the connecting ribbons 11s and 11t are changed over from the strip line patterns 8h and 8j to the strip line patterns 8f and 8k respectively so as to establish the normal connection, whereby normal operation can be executed.

Figure 11:
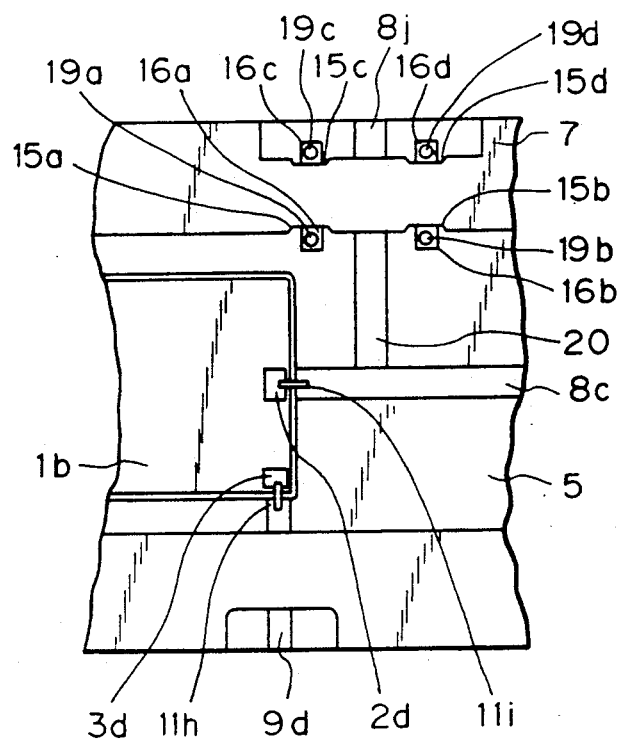
FIG. 11 is a drawing of another example of monitoring the characteristics of an integrated microwave circuit.

Another embodiment operable to monitor the characteristics of the integrated microwave circuit is illustrated in FIG. 11, wherein elements similar to those in FIGS. 10 and 2 are denoted by the same numerals. In this embodiment, a resistor element 20 is connected to the high-frequency signal strip line pattern 8c (FIG. 2) in parallel, and a coupling component of a high-frequency signal passing through the strip line 8c to the resistor element 20 is provided by way of the strip line 8j, whereby the characteristics of the integrated microwave circuit 1b is monitored.

Since it is possible with each of the embodiments shown in FIGS. 10 and 11 to monitor the characteristics of the integrated microwave circuit actually mounted in the case, any failure circuit can be specified after the integrated circuits are mounted in the case.

Modifications of the case for housing the integrated microwave circuits will next be described referring to FIGS. 12–18, wherein elements similar to those in FIGS. 2–11 are denoted by the same numerals.

Figure 12:
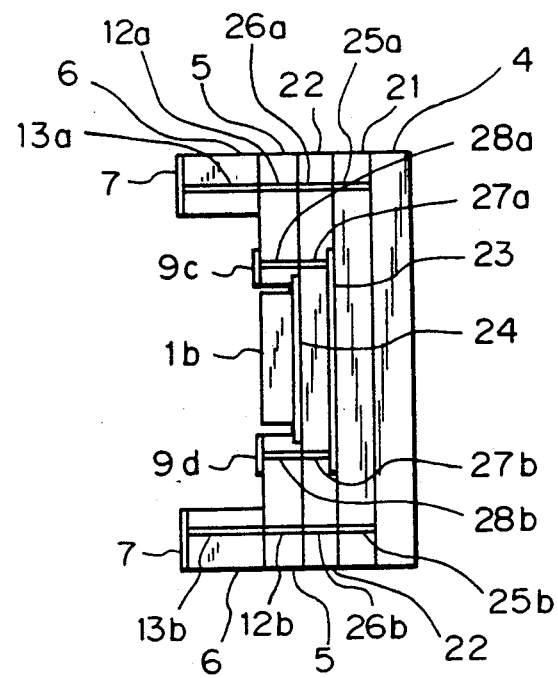
FIG. 12 is an example of provision of a wiring below an integrated microwave circuit.

FIG. 12 shows an arrangement corresponding to FIG. 3, in which a control signal wire pattern extends below the integrated microwave circuit 1b. In the constitution, third and fourth dielectric substrates 21 and 22 are superimposed on each other between the metal conductor 4 and the integrated circuit 1b, a grounding pattern 24 for the integrated circuit 1b is provided on the top surface of the fourth dielectric substrate 22, while a control signal wiring pattern 23 is provided on the top surface of the third dielectric substrate 21. In addition, through holes 27a and 27b, and 28a and 28b filled with conductive metals for connecting the wiring pattern 23 are provided in the fourth and first dielectric substrates 22 and 5 respectively so as to connect the wiring pattern 23 on the substrate 22 to the control signal strip line patterns 9c and 9d on the substrate 5, whereby the control signal wiring pattern can be disposed below the integrated circuit 1b. Further, through holes 25a and 25b, and 26a and 26b filled with conductive metals for electromagnetic shielding are provided at the periphery of the third and fourth dielectric substrates 21 and 22 respectively. The conductive metals in the through holes 25a, 25b, 26a and 26b are connected to those in through holes 12a and 12b provided in the substrate 5 to enable the electromagnetic shielding of the whole case.

Figure 13:
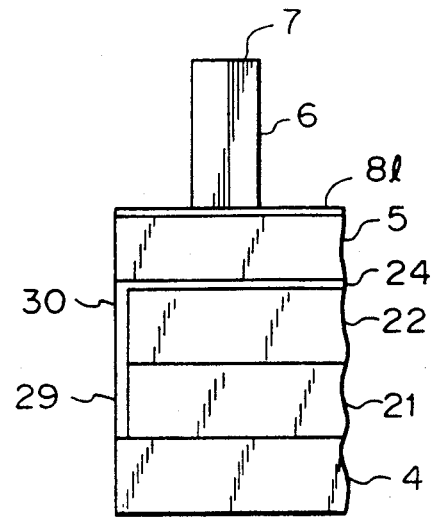
FIG. 13 is a drawing showing an example of ground connection of the high-frequency signal strip line at the end surface of the case.

FIG. 13 shows an example in which a ground connection of a high-frequency signal strip line pattern 8l is effected at the end of the case shown in FIG. 12. Side through holes, or notches, 29 and 30 are provided in the end surfaces of the third and fourth substrates 21 and 22, and filled with conductive metals connected between the metal conductor and grounding pattern 24 on the fourth dielectric substrate 22, whereby an interface of the high-frequency signal from/to the outside is enabled.

Figure 14:
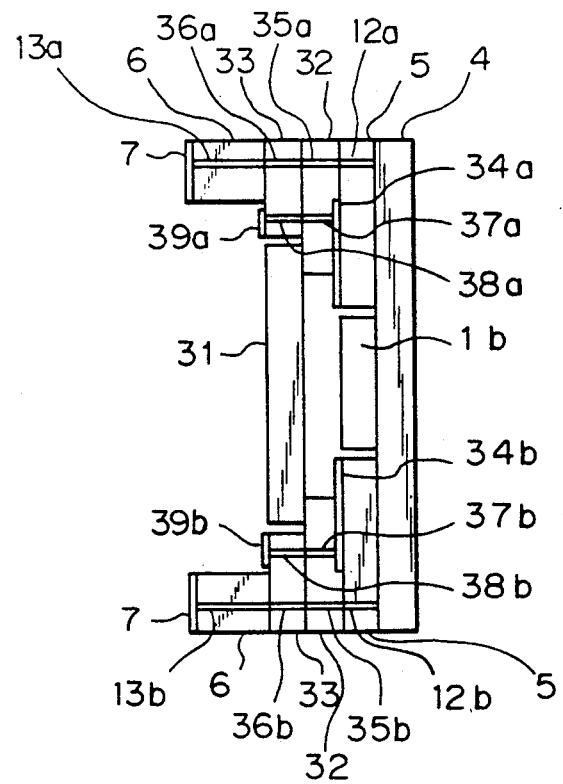
FIG. 14 is a drawing showing an example of stack mounting another type of integrated circuit.

FIG. 14 shows an example in which a control circuit or another type of high-frequency integrated circuit to be connected to the integrated microwave circuits is stack mounted over the integrated microwave circuit 1b. In this example, as shown in FIG. 14, fifth and sixth dielectric substrates 32 and 33 are stacked between the first and second dielectric substrates 5 and 6, and a seventh dielectric substrate 31 carrying thereon the control circuit or high-frequency integrated circuit of another type is placed on the fifth dielectric substrate 32. The sixth dielectric substrate 33 has a hole larger than a size of the seventh dielectric substrate 31, in which the substrate 31 received.

Strip line patterns 34a and 34b, and 39a and 39b are respectively provided on the first and sixth dielectric substrates 5 and 33, and through holes 37a and 37b, and 38a and 38b, which are filled with conductive metals, are respectively provided through the fifth and sixth dielectric substrates 32 and 33, whereby a control signal or the like is transferred from the control circuit or the like mounted on the seventh dielectric substrate 31 to the integrated circuit 1b through the strip line patterns 39a and 39b, the conductive metals in the through holes 37a and 37b, and 38a and 38b and the strip line patterns 34a and 34b.

Further, the fifth and sixth dielectric substrates 32 and 33 have through holes 35a and 35b, and 36a and 36b filled with conductive metals at portions corresponding to those of the through holes 12a and 12b of the first dielectric substrate 5 and through holes 13a and 13b of the second dielectric substrate 6. Accordingly, the whole electromagnetic shielding of the housing case is attained by the conductive metals filled in the through holes 12a, 12b, 13a, 13b, 35a, 35b, 36a and 36b and a metal cover (not shown) of the case.

Figure 15:
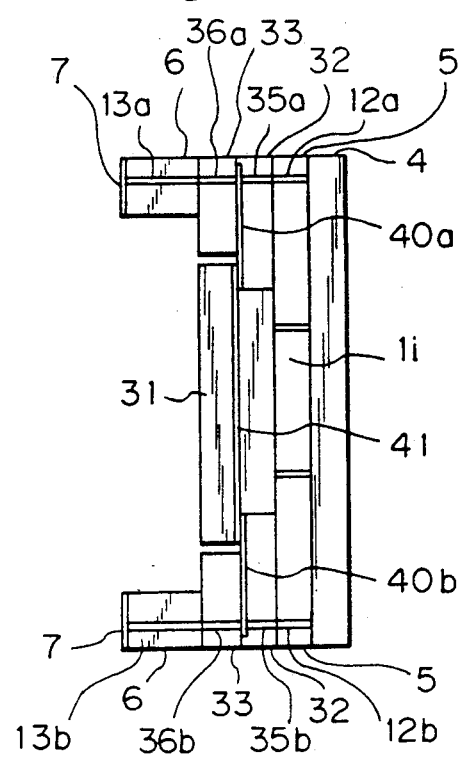
FIG. 15 is a drawing showing an example of effecting electromagnetic shielding by providing a ground pattern on the underside of the dielectric substrate carrying thereon another type of integrated circuit shown in FIG. 14.

Furthermore, in the case where there is an electromagnetic interface problem between the integrated microwave circuit and the control circuit or the like mounted on the seventh dielectric substrate 31 shown in FIG. 14, the problem can be eliminated by providing grounding patterns 40a and 40b on the upper surface of the fifth dielectric substrate 32 to be connected to the conductive metals in the through holes 35a and 35b and 36a and 36b of the fifth and sixth dielectric substrates 32 and 33, and a grounding pattern 41 on the under surface of the seventh dielectric substrate 31, as shown in FIG. 15. These grounding patterns 40a and 40b, and 41 are connected to each other by placing the seventh dielectric substrate 31 on the fifth dielectric substrate 32. Thus, it is possible to avoid any electromagnetic interference between the upper and lower positioned circuits.

Figure 16:
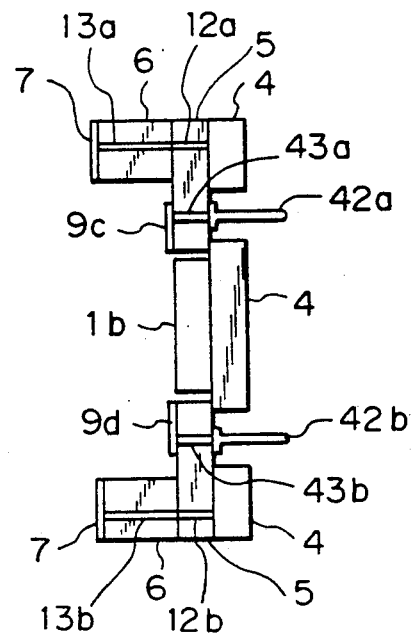
FIG. 16 is a drawing showing an example of taking out control signal input/output terminals in a vertical direction.
Figure 17:
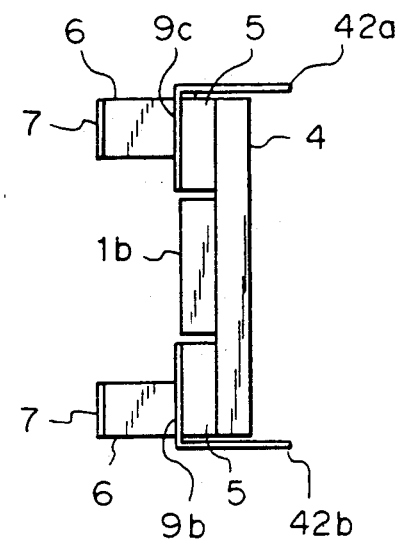
FIG. 17 is a drawing showing another example of taking out the control signal input/output terminals in a vertical direction.

FIG. 16 shows an example in which control signal input terminals are extended to the outside in a vertical direction. In this example, through holes 43a and 43b filled with conductive metals are provided in the first dielectric substrate 5 so as to connect to the strip line patterns 9c and 9d and control signal input terminals 42a and 42b are provided so as to connect to the conductive metals in the holes 43a and 43b. The terminals 42a and 42b extend in the vertical direction through two holes provided in the metal conductor 4. It is possible to extend the control signal strip line patterns 9c and 9b to the end surface of the housing case and connect them to the terminals 42a and 42b, as shown in FIG. 17. In this case shown in FIG. 17, the terminals 42a and 42b can extend in the vertical direction similar to in FIG. 16.

Figure 18:
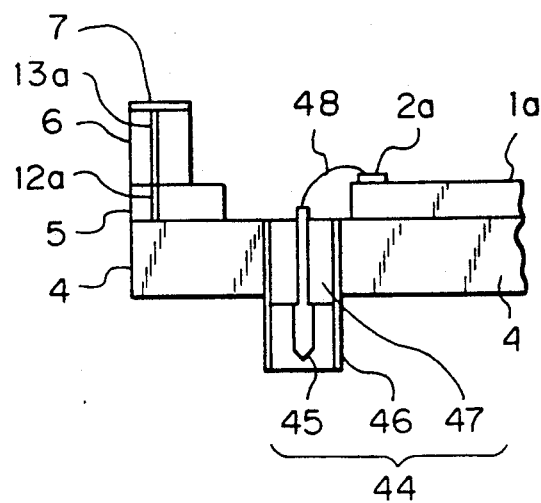
FIG. 18 is a drawing showing an example of taking out high-frequency signal input/output terminals in a vertical direction.

FIG. 18 shows another example in which high-frequency input/output terminals of the housing case extend to the outside in the vertical direction, and thus neither of the microwave strip pattern 8a nor 8e (in FIG. 2) for inputting/outputting the high-frequency signal is employed. Instead of using pattern 8a, in this example, a through hole is made in the metal conductor 4, a coaxial connector 44 including a core wire 45 is fixed at the through hole in the conductor 4, and the input/output pad 2a of the integrated circuit 1a is connected to the core wire 45 by way of a connecting wire 48. With regard to the pattern 8e, similar constitution is employed instead thereof.

According to the housing case of this invention, since the case is constituted by a plurality of dielectric substrates with necessary functions being integrally formed, the number of parts thereof and assembly man-hours can be reduced. Further, since it is easy to provide complete hermetic sealing, productivity can be increased. In addition, it is possible to provide wirings inside each of the substrates and between the substrates, various types of mounting such as stack mounting can be attained, while the mounting density is increased.

The invention has been described in detail with particular reference to certain preferred embodiment thereof, but it will be understood that variations and modifications can be effected within the spirit and scope of this invention.

What is claimed is:

1. A case for housing integrated microwave circuits comprising:
    a metal conductor body for carrying said integrated microwave circuits on the upper surface thereof;
    a first dielectric substrate stack-joined on said upper surface of said metal conductor body, and having a plurality of holes for receiving said integrated circuits respectively, signal strip line patterns on the upper surface thereof for connecting high-frequency signal input/output pads of said integrated circuits to each other and to external signal terminals, and shielding openings each filled with a conductive metal material connected to said metal conductor body for effecting electromagnetic shielding, said shielding openings being provided at interval(s) equal to or less than $\lambda/4$, where $\lambda$ is a wavelength of a high-frequency signal within a frequency band to be used; and
    a second dielectric substrate stack-joined on said first dielectric substrate, and having a plurality of holes associated with those in said first dielectric substrate for receiving said integrated circuits, a conductive metal plate for hermetical sealing and electromagnetic shielding on the upper surface thereof, shielding openings each filled with said conductive metal material connected between said conductive metal plate and said conductive metal material in each of said shielding openings of said first dielectric substrate, and electromagnetic shielding partitions between the adjacent holes for receiving said integrated circuits to provide an isolation of a wave guide mode between said integrated circuits.

2. A case according to claim 1, wherein said first dielectric substrate has grounding openings each filled with said conductive metal material to be connected between said metal conductor body and each of the grounding lines of said signal strip line patterns, near to the ends of said signal strip line patterns, and said second dielectric substrate has grounding openings each filled with the conductive metal material to be connected between said conductive metal plate on the upper surface of said second dielectric substrate and said conductive metal material in each of said grounding holes of said first dielectric substrate.

3. A case according to claim 2, wherein portions of said strip line patterns on said upper surface of said first dielectric substrate which passes through said second dielectric substrate comprise TRIPLATE ® lines.

4. A case according to claim 2, wherein each of said signal strip line patterns on said first dielectric substrate comprises two parts separated from each other by a slit, said first dielectric substrate further has test signal strip line patterns respectively provided between external test signal input/output terminals for inputting/outputting high-frequency test input/output signals and the vicinities of said slits and connecting wires each for selectively connecting one of said two parts of signal strip line patterns with the other or said test signal strip line pattern, whereby high-frequency characteristics of each integrated circuit are monitored by connecting one of said two parts with said test signal strip line pattern to input/output said high-frequency test input/output signals to/from said integrated circuit.

5. A case according to claim 1, wherein said first dielectric substrate further has test signal strip line patterns connected to external test signal input/output terminals for inputting/outputting high-frequency test input/output signals, and resistor elements connected between said test signal strip line patterns and said signal strip line patterns, whereby high-frequency characteristics of each integrated circuit are monitored by inputting/outputting said high-frequency test input/output signals to/from said integrated circuit.

6. A case according to claim 1 further comprising third and fourth dielectric substrates disposed between said metal conductor body and said first dielectric substrate, wherein said third dielectric substrate has control signal connecting patterns on the upper surface thereof, and shielding openings each filled with the conductive metal material connected to said metal conductor body;

said fourth dielectric substrate has a grounding pattern on the upper surface thereof for mounting said integrated circuits thereon, shielding openings each filled with the conductive metal material connected between the conductive metal material in said shielding opening of said first dielectric substrate and that of said third dielectric substrate, and pattern connecting openings each filled with the conductive metal material connected to said control signal connecting patterns on said third dielectric substrate; and said first dielectric substrate further has control signal strip line patterns in the upper surface thereof and pattern connecting openings each filled with the conductive metal material connected between said control signal strip line pattern and the conductive metal material in said pattern connecting opening of said fourth dielectric substrate, whereby said control signal connecting patterns are provided under said fourth dielectric substrate which mounts said integrated circuits.

7. A case according to claim 6, wherein said third dielectric substrate has grounding openings each filled with the conductive material connected to said metal conductor body, and said fourth dielectric substrate has grounding openings each filled with the conductive material connected between that of said third dielectric substrate and said grounding pattern thereon.

8. A case according to claim 6, wherein said grounding openings of said third and fourth dielectric substrates comprise notches formed through the side surface thereof.

9. A case according to claim 1, further comprising fifth and sixth dielectric substrates disposed between said first and second dielectric substrates, and a seventh dielectric substrate stack joined with said fifth dielectric substrate and received inside of said sixth dielectric substrate, wherein said fifth dielectric substrate has pattern connecting openings each filled with the conductive metal material connected to said signal strip line pattern and shielding openings each filled with the conductive material connected to that of said first dielectric substrate;

said sixth dielectric substrate has signal strip line patterns on the upper surface thereof connected to said external signal input/output terminals, pattern connecting openings each filled with the conductive metal material connected between that of said fifth dielectric substrate and said signal strip line pattern thereon, and shielding openings each filled with the conductive metal material connected between those of said fifth and second dielectric substrates; and said seventh dielectric substrate has portions for receiving other integrated circuits to be connected to said integrated microwave circuits received in said first dielectric substrate.

10. A case according to claim 9, wherein said other integrated circuits comprise control circuits for controlling said integrated microwave circuits, said first dielectric substrate has control signal strip line patterns on the upper surface thereof each for supplying a control signal to said integrated microwave circuit, and said sixth dielectric substrate has control signal strip line patterns on the upper surface thereof and control signal connecting openings each filled with the conductive metal material connected between said control signal strip line patterns of said first and sixth dielectric substrates.

11. A case according to claim 10, wherein said fifth dielectric substrate has a grounding pattern connected to the conductive metal material on the upper surface thereof, and seventh dielectric substrate has a grounding pattern on the lower surface thereof to be connected to said grounding pattern of said fifth dielectric substrate, whereby electromagnetic shielding of the side opposite to said metal conductor body is effected.

12. A case according to claim 6 further comprising control signal input terminals connected to said control signal connecting patterns on said first dielectric substrate and extending to the outside in a direction vertical to said metal conductor body from the lower surface of said body.

13. A case according to claim 1, wherein said external signal terminals comprise coaxial connectors fixed at said metal conductor body and extending to the outside in a direction vertical to said body, said core wires of which are respectively connected to said signal input/output pads of said integrated circuits.

* * * * *